United States Patent
Lin et al.

(10) Patent No.: US 8,901,726 B2
(45) Date of Patent: Dec. 2, 2014

(54) PACKAGE ON PACKAGE STRUCTURE AND METHOD OF MANUFACTURING THE SAME

(71) Applicant: Taiwan Semiconductor Manufacturing Company, Ltd., Hsin-Chu (TW)

(72) Inventors: Chun-Cheng Lin, Taipei (TW); Hsiu-Jen Lin, Zhubei (TW); Cheng-Ting Chen, Taichung (TW); Wei-Yu Chen, Taipei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/708,461

(22) Filed: Dec. 7, 2012

(65) Prior Publication Data

US 2014/0159233 A1    Jun. 12, 2014

(51) Int. Cl.
*H01L 23/02* (2006.01)
*H01L 25/10* (2006.01)
*H01L 23/00* (2006.01)
*H01L 25/00* (2006.01)
*H01L 23/498* (2006.01)
*H01L 25/065* (2006.01)

(52) U.S. Cl.
CPC ........ *H01L 23/49816* (2013.01); *H01L 25/105* (2013.01); *H01L 2225/06513* (2013.01); *H01L 2225/1058* (2013.01); *H01L 2225/06568* (2013.01); *H01L 2225/1023* (2013.01); *H01L 24/81* (2013.01); *H01L 24/97* (2013.01); *H01L 2224/16225* (2013.01); *H01L 2225/06541* (2013.01); *H01L 24/94* (2013.01); *H01L 2224/16145* (2013.01); *H01L 2224/97* (2013.01); *H01L 2225/0651* (2013.01); *H01L 25/50* (2013.01); *H01L 2224/94* (2013.01); *H01L 2225/06565* (2013.01); *H01L 2924/15331* (2013.01); *H01L 2924/15311* (2013.01); *H01L 25/0657* (2013.01)
USPC ........... 257/686; 257/777; 257/781; 438/107; 438/109; 438/614

(58) Field of Classification Search
USPC .......... 257/686, 777, 780, 781; 438/107, 108, 438/109, 613, 614
See application file for complete search history.

(56) References Cited

U.S. PATENT DOCUMENTS

| | | | |
|---|---|---|---|
| 8,525,318 B1 * | 9/2013 | Kim et al. | 257/686 |
| 8,531,019 B2 * | 9/2013 | Onodera | 257/686 |
| 8,531,034 B2 * | 9/2013 | Byun et al. | 257/787 |
| 8,531,043 B2 * | 9/2013 | Ha et al. | 257/787 |
| 8,704,354 B2 * | 4/2014 | Cheng et al. | 257/686 |
| 8,716,872 B2 * | 5/2014 | Kwon et al. | 257/777 |
| 2008/0017968 A1 * | 1/2008 | Choi et al. | 257/686 |
| 2008/0169544 A1 * | 7/2008 | Tanaka et al. | 257/686 |
| 2008/0211079 A1 * | 9/2008 | Onodera | 257/686 |
| 2008/0230887 A1 * | 9/2008 | Sun et al. | 257/686 |
| 2010/0019360 A1 * | 1/2010 | Khan et al. | 257/675 |

(Continued)

*Primary Examiner* — Sheila V Clark
(74) *Attorney, Agent, or Firm* — Slater & Matsil, L.L.P.

(57) ABSTRACT

A package on package structure includes a first substrate having a first region and a second region, a bump formed on the first region of the first substrate, a first semiconductor die bonded to the second region of the first substrate, and a semiconductor die package bonded to the first substrate. The bump includes a metallic structure and a plurality of minor elements dispersed in the metallic structure. The semiconductor die package includes a connector bonded to the bump, and the first semiconductor die is between the semiconductor die package and the first substrate.

20 Claims, 4 Drawing Sheets

(56) References Cited

U.S. PATENT DOCUMENTS

| | | | |
|---|---|---|---|
| 2010/0171207 A1* | 7/2010 | Shen et al. .................... 257/686 |
| 2010/0213591 A1* | 8/2010 | Ho et al. ........................ 257/686 |
| 2010/0224978 A1* | 9/2010 | Shim et al. .................... 257/686 |
| 2011/0012249 A1* | 1/2011 | Daubenspeck et al. ....... 257/686 |
| 2011/0062574 A1* | 3/2011 | Jang et al. ..................... 257/686 |
| 2011/0133325 A1* | 6/2011 | Moon et al. .................... 257/686 |
| 2011/0140258 A1* | 6/2011 | Do et al. ........................ 257/686 |
| 2011/0227209 A1* | 9/2011 | Yoon et al. .................... 257/686 |

* cited by examiner

PACKAGE ON PACKAGE STRUCTURE AND METHOD OF MANUFACTURING THE SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of materials over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area and/or lower height than packages of the past, in some applications. Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

DETAILED DESCRIPTION

Figure 1A:
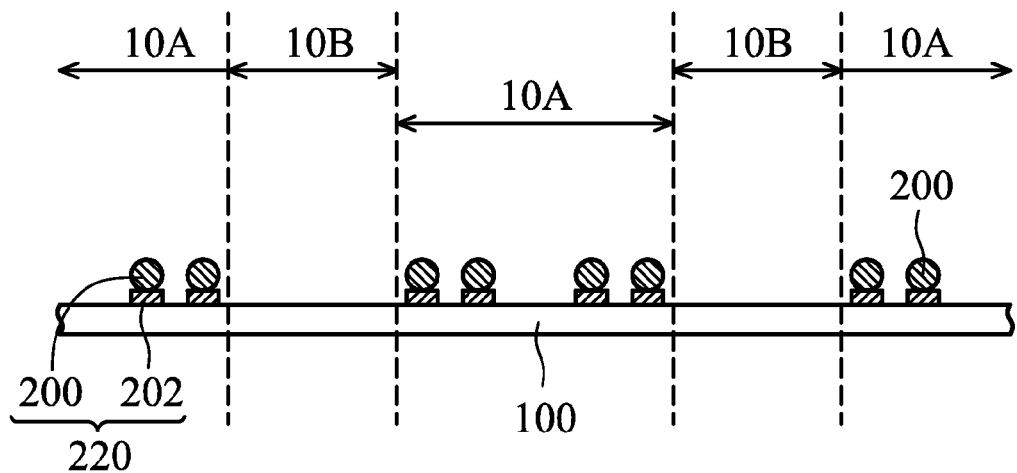
FIGS. 1-6 are cross-sectional views illustrating a method of forming a package on package structure at various intermediate stages according to some embodiments.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIGS. 1-6 are cross-sectional views illustrating a package on package structure at various intermediate stages according to some embodiments.

FIG. 1A shows a first substrate 100 with bumps 200 mounted on contact pads 210 for making external connecting structures 220 in accordance with some embodiments. The first substrate 100 may be made of a semiconductor wafer, or a portion of a wafer. In some embodiments, the first substrate 100 includes silicon, gallium arsenide, silicon on insulator ("SOI") or other similar materials. In some embodiments, the first substrate 100 also includes passive devices such as resistors, capacitors, inductors and the like, or active devices such as transistors. In some embodiments, the first substrate 100 includes additional integrated circuits. The first substrate 100 may further include through substrate vias (TSVs) and may be an interposer. In addition, the first substrate 100 may be made of other materials. For example, in some embodiments, the first substrate 100 is a multiple-layer circuit board. In some embodiments, the first substrate 100 also includes bismaleimide triazine (BT) resin, FR-4, FR-5, which is similar to FR-4, ceramic, glass, plastic, tape, film, or other supporting materials that may carry the conductive pads or lands needed to receive conductive terminals. The contact pads 210 are made of conductive material(s) and are connected to interconnect (not shown in FIG. 1A) in the first substrate 100. The bumps 200 are mounted on the contact pads 210 and electrically connected to the contact pads 210. Each bump 200 connected to the contact pad 200 forms an external connecting structure 220. The mounting process may involve placing the bumps 200 on the contact pads 210 and performing a reflow process to bond the bumps 200 to the contact pads 210.

Figure 1B:
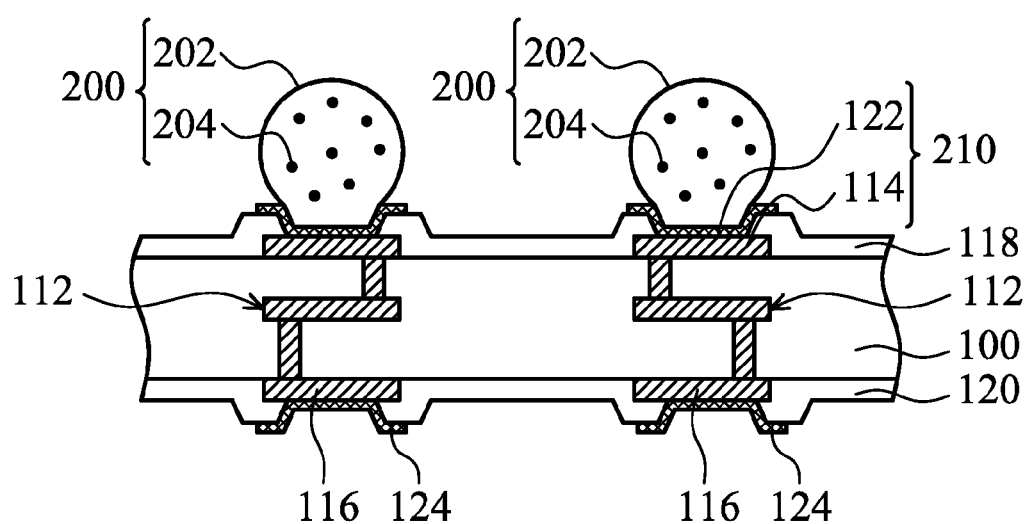

The first substrate 100 includes first regions 10A and second regions 10B. Each first region 10A includes one or more external connecting structures 220 formed thereon. Each second region 10B is between two adjacent first regions 10A and a semiconductor die will be placed on at least one of the second regions 10B in subsequent steps. FIG. 1B is a cross-sectional view of an enlarged region of the first region 10A shown in FIG. 1A in accordance with some embodiments. The first substrate 100 includes interconnect structures 112, which connect to first conductive pads 114 and second conductive pads 116 formed on opposite sides of the first substrate 100 in accordance with some embodiments. In some embodiments, the interconnect structures 112 includes the metal lines and vias formed of copper or copper alloys. In some embodiments, the interconnect structures 112 are surrounded and insulated by dielectric layers, which may be made of undoped silicon glass, doped film, low dielectric constant (low-k) dielectric, or combinations thereof. The first conductive pads 114 are part of the contact pad 210 as shown in FIG. 1A. In some embodiments, the first conductive pads 114 include aluminum, copper, silver, gold, nickel, tungsten, titanium, tatanium, titanium nitride, tatanium nitride, alloys thereof, and/or multi-layers thereof. A portion of each of the first conductive pads 114 is protected by a first passivation layer 118 with the remaining portion of each of the first conductive pads 114 exposed. In some embodiments, the second conductive pads 116 include aluminum, copper, silver, gold, nickel, tungsten, titanium, tatanium, titanium nitride, tatanium nitride, alloys thereof, and/or multi-layers thereof. Similarly, each of the second conductive pads 116 is partially protected by a second passivation layer 120. The first passivation layer 118 and the second passivation layer 120 are made of soft (or deformable) dielectric material(s), such as polymers, to relieve bonding stress, in accordance with some embodiments. In some embodiments, the first passivation layer 118 and the second passivation layer 120 are made of dielectric material(s), such as silicon oxide, silicon nitride, undoped silicate glass (USG), polyimide, or combinations thereof.

A first bonding layer 122 is formed over the first conductive pad 114, in accordance with some embodiments. The first bonding layer 122 that is part of the contact pad 210 (shown in FIG. 1A) could help bonding the bump 200 to the first conductive pad 114. In some embodiments, the first bonding layer 122 is made of solder alloy including Sn, Pb, Ag, Cu, Ni, bismuth (Bi), or combinations thereof. Similarly, a second bonding layer 124 is formed over the second conductive pad 116, in accordance with some embodiments. In some embodiments, the second bonding layer 124 is made of solder alloy including Sn, Pb, Ag, Cu, Ni, bismuth (Bi), or combinations thereof. In some embodiments, the second bonding layer 124 is not needed. In some embodiments, the second bonding layer 124 is made of the same material as the first bonding layer 122. In some embodiments, the second bonding layer 124 is made of a material different from that of the first bonding layer 122. The existence and choice of the material(s) for second bonding layer 124 depend on the material of the second conductive pad 116 and the external connectors (not shown) to be bonded to the second conductive pad 116. Each of the second conductive pads 116, accompanying second bonding layer 124 and the external connector form another external connecting structure, which is used to bond with an external connector in accordance with some embodiments.

The bump 200 includes a metallic structure 202 and minor elements 204 dispersed in the metallic structure 202 in accordance with some embodiments. The metallic structure 202 is made of non-solder materials, such as copper, aluminum, silver, gold, nickel, tungsten, alloys thereof. The metallic structure 202 can be formed as a ball, a pillar or any geometrical shapes. In some embodiments, the metallic structures 202 are metal balls. The minor elements 204 dispersed in the metallic structure 202 are selected from germanium (Ge), zinc (Zn) indium (In), nickel (Ni), phosphorus (P), iron (Fe), manganese (Mn), titanium (Ti), cerium (Ce), antimony (Sb), and combinations thereof, although other minor elements may be added, in accordance with some embodiments. Throughout the description, the term "minor elements" refers to the elements that have a low weight percentage in the resulting bump 200, wherein the weight percentage of the minor elements 204 may be less than about 0.2 percent, for example. The minor elements 204, depending on the material of metallic structure 202, may have the functions such as preventing oxidation, improving wettability, enhancing mechanical behavior, improving creep resistance, improving electro-migration resistance, and/or the like. In an exemplary embodiment, the weight percentage of minor elements 204 is greater than about 0.001 percent, or greater than about 0.005 percent, or between about 0.001 percent and about 0.2 percent. In some embodiments, the minor elements 204 can be added into the metallic structure 202 by ion implantation. The implantation may include a vertical implantation, and optionally tilted implantations. In alternative embodiments, the implantation may be performed after the formation of the metallic structure 202, and the minor elements 204 may be injected to a surface layer of the metallic structure 202. In some embodiments, the minor elements 204 can be diffused into the metallic structure 202 by providing a flux coating mixed with minor elements on the metallic structure, performing a thermal reflowing process, and removing the residue of the flux coating from the metallic structure. In some embodiments, the (maximum) width of the metallic structure 202 is in a range from about 100 μm to about 200 μm. In some embodiments, the pitch of the metallic structures 202 is in a range from about 150 μm to about 300 μm.

After the bumps 200 are placed on the first bonding layer 122, a reflow process is performed to bond the bumps 200 to the first conductive pads 114 with the help of the first bonding layer 122 in accordance with some embodiments. For example, if the metallic structures 202 and the first conductive pads 114 are made of copper or copper alloy, a bonding layer 122 made of solder would help bond the metallic structures 202 and first conductive pads 114 together. In some embodiments, the reflow temperature is in a range from about 180° C. to about 240° C. After the reflow process, the bumps 200 are bonded to (or mounted on) the contact pads 210 to form the external connecting structure 220.

Figure 2:
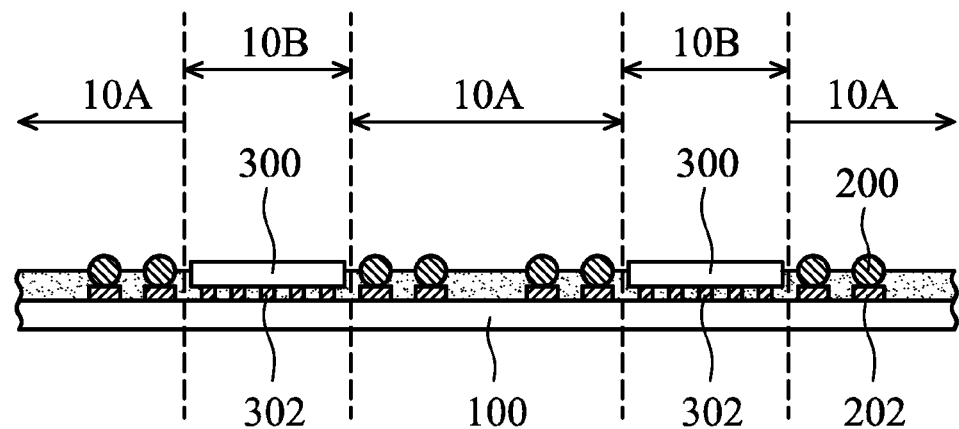

Referring to FIG. 2, semiconductor dies 300 are placed on and bonded to the first substrate 100 in accordance with some embodiments. The semiconductor dies 300 are placed on the second regions 10B. Each semiconductor die 300 on the second region 10B is surrounded by the external connecting structures 220 formed on the first region 10A. Each semiconductor die 300 includes a semiconductor substrate as employed in a semiconductor integrated circuit fabrication, and integrated circuits may be formed therein and/or thereupon. The semiconductor substrate is defined to mean any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. Examples of the various microelectronic elements that may be formed in the semiconductor dies 300 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices. In some embodiments, the connectors (not shown) on the semiconductor dies 300 are bonded to contact pads (not shown) on the second region 10B of the first substrate 100 to form bonding structures 302.

Figure 3:
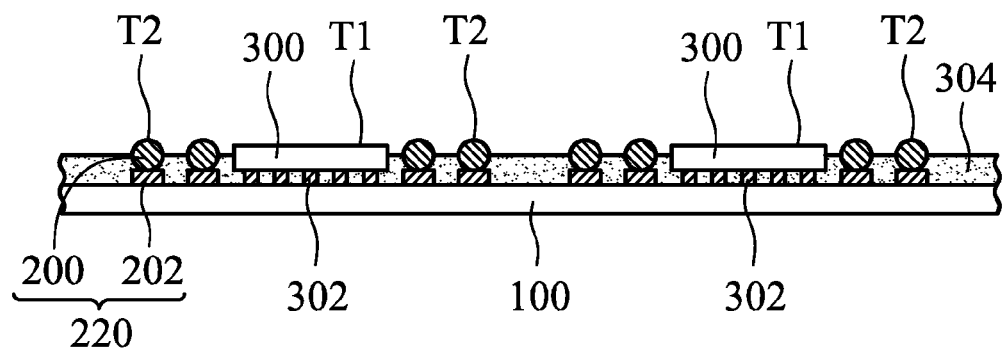

Referring to FIG. 3, a molded underfill (MUF) material layer 304 is applied on the first substrate 100 to expose portions T1 of semiconductor dies 300 and expose portions T2 of the bumps 200 as well, in accordance with some embodiments. For example, the top portion T1 is a backside of the semiconductor die 300, and the top portion T2 is the upper portion of the bump 200. In some embodiments, the MUF material layer 304 is made of epoxy resin (amine type, phenol type, anhydrates types, etc.), silicon fillers, curing agents, additives and/or hardener materials. The MUF material layer 304 still can protect the joint region between bumps 200 and contact pads 210.

Figure 4:
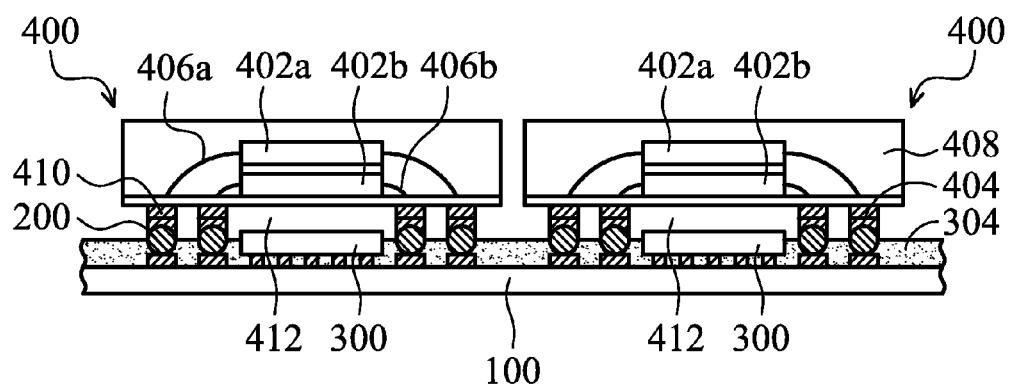

Afterwards, semiconductor die packages 400 are placed above the first substrate 100 and are bonded onto bumps 200, as shown in FIG. 4 in accordance with some embodiments. In some embodiments, each semiconductor die package 400 includes one or more semiconductor dies. For example, each semiconductor die package 400 includes a semiconductor die 402a disposed over another semiconductor die 402b. In alternative embodiments, the semiconductor die package 400 could include one semiconductor die or more than two semiconductor dies. The semiconductor die 402a and/or 402b may include various microelectronic elements, as described above for semiconductor dies 300. The examples of these various microelectronic elements have been described above. The semiconductor die 402a and/or 402b is bonded to a second substrate 404 and electrically connected to the second substrate 404 via bonding wires in accordance with some embodiments. For example, the semiconductor die 402a is electrically connected to the second substrate 404 via first bonding wires 406a, and the semiconductor die 402b electrically connected to the second substrate 404 via second bonding wires 406b. The second substrate 404 may include various materials and/or components described above. Each semiconductor die package 400 also includes a molding compound 408, which covers the semiconductor die 402a and/or 402b, and also the bonding wire 406a and/or 406b.

Each semiconductor die package 400 includes a number of connectors 410 electrically coupled to the bumps 200 in accordance with some embodiments. The connectors 410 are made of a conductive material, such as solder, solder alloy, etc. The connectors 410 are formed on conductive structures (not shown) on the surface of second substrate 404 to electrically connect to elements in the second substrate 404. After the semiconductor die packages 400 are placed over the first substrate 100 with the connectors 410 in contact with the bumps 200, a reflow process is performed to bond the connectors 410 to bumps 200, in accordance with some embodiments. By forming the MUF material layer 304, there is an air gap 412 between each semiconductor die package 400 and the semiconductor die 300 in accordance with some embodiments. The air gap 412 allows the semiconductor die 402a and/or 402b of the semiconductor die package 400 to be substantially thermally isolated from the semiconductor die 300. As a result, heat generated from the semiconductor die 402a and/or 402b, which are in proximity of the semiconductor die 300, is less likely to be transferred to the semiconductor die 300, and vice versa. The MUF material layer 304 also can help reducing the bending of first substrate 100 before singulation and formed packages after singulation due to mismatch of coefficient of thermal expansions (CTEs).

Figure 5:
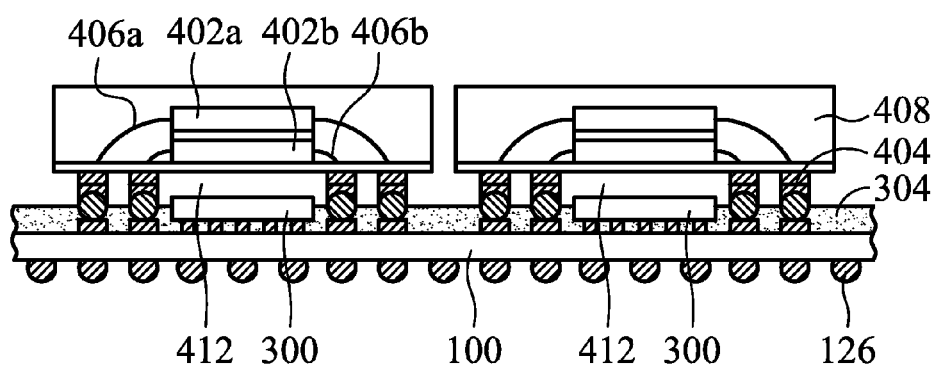

Referring to FIG. 5, a plurality of connectors 126 are placed on and bonded to the second conductive pad 116 (shown in FIG. 1B) of the first substrate 100 in accordance with some embodiments. Thus, the second conductive pad 116 (shown in FIG. 1B), the optional second bonding layer 124 (shown in FIG. 1B) and the connector 126 form another external connecting structure on the side opposite from the external connecting structure 220. The connectors 126 are made of conductive materials, which could be solder, solder alloy, copper, copper alloy, gold, or gold alloy, etc. For example, the connectors 126 are bonded to the second conducting pads 116 by a reflow process. In some embodiments, the connectors 126 are solder balls made of solder alloy including Sn, Pb, Ag, Cu, Ni, bismuth (Bi), or combinations thereof. In some embodiments, the (maximum) width of the solder balls is in a range from about 100 µm to about 300 µm. In some embodiments, the pitch of the solder balls is in a range from about 150 µm to about 300 µm.

Figure 6:
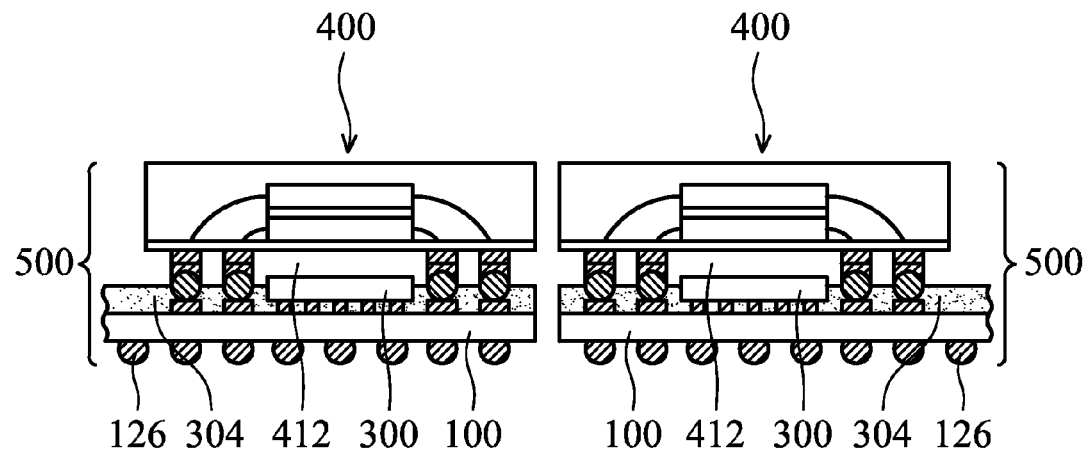

After the connectors 126 are bonded to the opposite side of first substrate 100 from the semiconductor die packages 400, the first substrate 100 with bonded multiple semiconductor die packages 400 and semiconductor dies 300 is singulated (or sawed) into individual packages, and each of which has one semiconductor die package 400 and one semiconductor die 300. FIG. 6 shows the first substrate 100 after it is singulated into individual package 500, in accordance with some embodiments. Each individual package 500 is a package on package (PoP) structure and has one semiconductor die package 400 and one semiconductor die 300, in accordance with some embodiments. By using the bump 200 including the metallic structure 202 with minor elements 204 added therein, the metal oxidation is prevented from the metallic structure 202. Accordingly, the properties of the bumps 200 can be significantly improved, and the reliability of the PoP structure can be enhanced.

Figure 7:
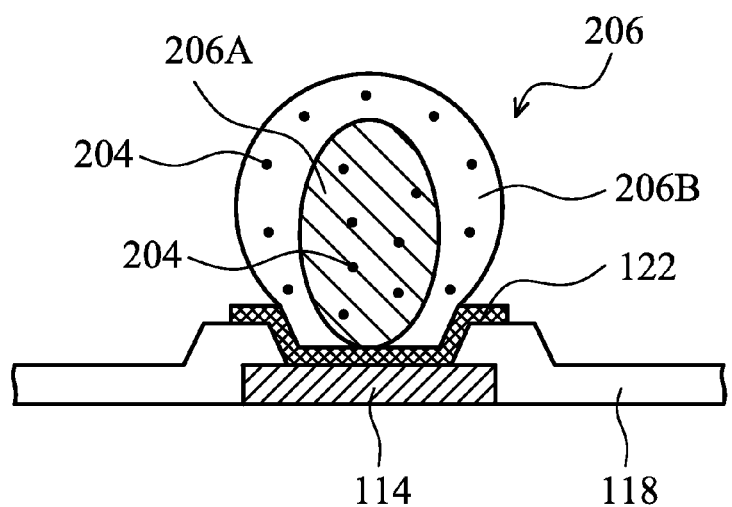
FIG. 7 is a cross-sectional view of a bump according to some embodiments.

FIG. 7 is a cross-sectional view of another bump structure according to some embodiments. The explanation of the same or similar portions to the description in FIG. 1B will be omitted. The metallic structure 202 made of non-solder materials described in FIG. 1B can be replaced by a solid core solder ball 206, which includes a central core 206A of a metal material and a solder material layer 206B surrounding the central core 206A. The melting point of the metal material is higher than the melting point of the solder material layer 206B. In some embodiments, the metal material of the central core 206A is copper or copper alloy. In fabricating the solid core solder balls 206, the solder material layer 206B can be plated onto the central core 206A, or the central core 206A can be dipped in liquid solder with surface tension coating the central core 206A. In some embodiments, the metal material of the central core 206A includes a lead tin alloy having a higher melting point than conventional solder, such as 90% lead and 10% tin by weight which melts at approximately 290° C. The use of an outer layer of solder material contributes to the total volume of solder in the joint and makes for an easier mounting process. Further, the solid core standoff makes flatness of the package less critical during the mounting of the package. In addition, the minor elements 204 are also added into the solid core solder balls 206 in accordance with some embodiments. The minor elements may be added or dispersed in the central core 206A, the solder material layer 206B, or a combination thereof.

According to some embodiments, a package on package structure includes a first substrate having a first region and a second region, a bump formed on the first region of the first substrate, a first semiconductor die bonded to the second region of the first substrate, and a semiconductor die package bonded to the first substrate. The bump includes a metallic structure and a plurality of minor elements dispersed in the metallic structure. The first semiconductor die is between the semiconductor die package and the first substrate, and the semiconductor die package includes a connector bonded to the bump.

According to some embodiments, a method of forming a package structure includes forming a plurality of bumps on a first substrate, and bonding a first semiconductor die to the first substrate in a region surrounded by the plurality of bumps. Each of the plurality of bumps includes a metallic ball and a plurality of minor elements dispersed in the metallic ball.

According to some embodiments, a package structure includes a semiconductor substrate having an interconnect structure, a plurality of first conductive pads and a plurality of second conductive pads formed on opposite sides of the semiconductor substrate and electrically connected to the interconnect structure, a plurality of bumps formed overlying and electrically connected to the first conductive pads, and a semiconductor die bonded to the semiconductor substrate in a region surrounded by the plurality of bumps. At least one of the bumps includes a metallic ball and a plurality of minor elements dispersed in the metallic structure.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A package on package structure, comprising:
a first substrate having a first region and a second region;
a bump formed on the first region of the first substrate, wherein the bump comprises a metallic structure and a plurality of minor elements dispersed in the metallic structure, wherein the metallic structure comprises a central core formed of a metal material and a solder material layer surrounding the central core;
a first semiconductor die bonded to the second region of the first substrate; and
a semiconductor die package bonded to the first substrate, wherein the first semiconductor die is between the package and the first substrate, and wherein the semiconductor die package comprises a connector bonded to the bump, and further comprising an air gap between an exposed surface of the first semiconductor die and the semiconductor die package.

2. The package on package structure of claim 1, wherein the metallic structure is formed of a non-solder material.

3. The package on package structure of claim 2, wherein the non-solder material comprises copper or copper alloy.

4. The package on package structure of claim 1, wherein the plurality of minor elements comprises germanium (Ge), zinc (Zn) indium (In), nickel (Ni), phosphorus (P), iron (Fe), manganese (Mn), titanium (Ti), cerium (Ce), antimony (Sb), or combinations thereof.

5. The package on package structure of claim 1, further comprising a molded underfill material layer on the first substrate, wherein portions of the first semiconductor die and the bump are embedded in the molded underfill material layer.

6. The package on package structure of claim 5, further comprising an air gap between the first semiconductor die and the semiconductor die package.

7. The package on package structure of claim 1, wherein the semiconductor die package comprises a second semiconductor die electrically connected to a second substrate through a bonding wire.

8. The package on package structure of claim 1, wherein the central core includes a metal material selected from the group consisting of copper, aluminum, silver, gold, nickel, tungsten, alloys thereof, and combinations thereof.

9. The package on package structure of claim 1, wherein the plurality of minor elements constitute less than about 0.2% by weight of the bump.

10. The package on package structure of claim 1, wherein the plurality of minor elements is dispersed in the central core, the solder material layer, or a combination thereof.

11. A method of forming a package structure, comprising:
forming a plurality of bumps on a first region of a first substrate, wherein each of the plurality of bumps comprises a metallic ball, a solder material surrounding the metal ball, and a plurality of minor elements dispersed in the metallic ball;
bonding a first semiconductor die to the first substrate in a region surrounded by the plurality of bumps;
providing a molded underfill material layer on the first substrate, and exposing top portions of the first semiconductor die and the plurality of bumps and leaving an air gap above the first semiconductor die; and
bonding a semiconductor die package to a second region of the first substrate, wherein the first semiconductor die is between the package and the first substrate and wherein the semiconductor die package comprises a plurality of connectors respectively bonded to the plurality of bumps.

12. The method of claim 11, wherein the plurality of minor elements comprises germanium (Ge), zinc (Zn) indium (In), nickel (Ni), phosphorus (P), iron (Fe), manganese (Mn), titanium (Ti), cerium (Ce), antimony (Sb), or combinations thereof.

13. The method of claim 11, wherein forming the plurality of bumps comprises forming a plurality of non-solder balls and adding the plurality of minor elements into the non-solder balls.

14. The method of claim 13, wherein the non-solder balls comprises copper or copper alloy.

15. The method of claim 11, wherein each of the plurality of bumps comprises a central core formed of copper or copper alloy and a solder material layer surrounding the central core.

16. The method of claim 15, wherein each of the plurality of bumps comprises the plurality of minor elements dispersed in the central core, the solder material layer, or a combination thereof.

17. The method of claim 11, wherein the step of further comprising providing a molded underfill material layer on the first substrate, and exposing top portions of the first semiconductor die and the plurality of bumps creates an air gap between the first semiconductor die and a semiconductor die package subsequently bonded to the first substrate.

18. The method of claim 11, further comprising bonding a semiconductor die package to the first substrate, wherein the first semiconductor die is between the first substrate and the semiconductor die package, and wherein the semiconductor die package comprises a connector bonded to the bump.

19. A package structure, comprising:
a semiconductor substrate comprises an interconnect structure;
a plurality of first conductive pads and a plurality of second conductive pads formed on opposite sides of the semiconductor substrate and electrically connected to the interconnect structure;
a plurality of bumps formed overlying and electrically connected to the first conductive pads, wherein at least one of the plurality of bumps comprises a metallic ball and a plurality of minor elements dispersed in the metallic structure wherein the metallic structure comprises a central core formed of a metal material and a solder material layer surrounding the central core; and
a semiconductor die bonded to the semiconductor substrate in a region surrounded by the plurality of bumps.

20. The package on package structure of claim 19, wherein the plurality of minor elements comprises germanium (Ge), zinc (Zn) indium (In), nickel (Ni), phosphorus (P), iron (Fe), manganese (Mn), titanium (Ti), cerium (Ce), antimony (Sb), or combinations thereof.

* * * * *